United States Patent
Wang et al.

(10) Patent No.: US 9,194,904 B2
(45) Date of Patent: Nov. 24, 2015

(54) SYSTEMS AND METHODS FOR DETECTING LEAKAGE PATHS IN A BATTERY SENSING CIRCUIT

(71) Applicant: GM GLOBAL TECHNOLOGY OPERATIONS LLC, Detroit, MI (US)

(72) Inventors: Fang Wang, Troy, MI (US); Andrew K. Chandler, Plymouth, MI (US); Paul W. Kelley, Lake Orion, MI (US); Richard H. Miller, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 261 days.

(21) Appl. No.: 13/922,930

(22) Filed: Jun. 20, 2013

(65) Prior Publication Data

US 2014/0376137 A1 Dec. 25, 2014

(51) Int. Cl.
*H02H 3/00* (2006.01)
*H02H 7/26* (2006.01)
*G01R 31/02* (2006.01)
*G01R 19/165* (2006.01)

(52) U.S. Cl.
CPC ........ *G01R 31/025* (2013.01); *G01R 19/16542* (2013.01)

(58) Field of Classification Search
CPC .. H01M 10/48; G01R 31/362; G01R 31/3658
USPC ................ 361/68; 320/118, 122; 340/636.12, 340/636.15
See application file for complete search history.

(56) References Cited

U.S. PATENT DOCUMENTS

| | | | |
|---|---|---|---|
| 8,786,289 B2* | 7/2014 | Sekiguchi | 324/433 |
| 8,922,165 B2* | 12/2014 | Bills | 320/118 |
| 2004/0239333 A1* | 12/2004 | Kikuchi | 324/434 |
| 2010/0123434 A1* | 5/2010 | Iwata | 320/118 |
| 2010/0259276 A1* | 10/2010 | Streit | 324/525 |
| 2011/0172940 A1* | 7/2011 | Wood et al. | 702/63 |
| 2011/0199223 A1* | 8/2011 | Akimov et al. | 340/636.1 |
| 2011/0208451 A1* | 8/2011 | Champlin | 702/63 |
| 2012/0175953 A1* | 7/2012 | Ohkawa et al. | 307/18 |
| 2012/0310566 A1* | 12/2012 | Hoshino et al. | 702/63 |
| 2014/0285936 A1* | 9/2014 | Garbacik et al. | 361/88 |

* cited by examiner

*Primary Examiner* — Stephen W Jackson
*Assistant Examiner* — Christopher Clark
(74) *Attorney, Agent, or Firm* — Phillips Ryther & Winchester; John P. Davis

(57) ABSTRACT

System and methods for detecting electrical leakages in a battery sensing are presented. In certain embodiments, the systems and methods allow a vehicle battery sensing circuit and/or other associated system to detect certain electrical leakages and implement one or more actions to protect vehicle systems from damage resulting from such leakages.

20 Claims, 5 Drawing Sheets

SYSTEMS AND METHODS FOR DETECTING LEAKAGE PATHS IN A BATTERY SENSING CIRCUIT

TECHNICAL FIELD

This disclosure relates to systems and methods for detecting electrical leakages in a battery sensing circuit. More specifically, but not exclusively, this disclosure relates to systems and methods for detecting an electrical leakage path in a battery sensing circuit associated with a vehicle battery system and for implementing one or more protective actions to protect the battery sensing circuit from damage.

BACKGROUND

Passenger vehicles often include electric batteries for operating a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system may be used to power electric drivetrain components of the vehicle (e.g., electric drive motors and the like).

A battery system may be associated with a battery sensing circuit. The battery sensing circuit may be configured to perform one or more measurements relating to the battery system and/or report a state of the battery system. During operation, however, conventional battery sensing circuits may experience certain electrical current leakages. Electrical leakages in the battery sensing circuits may damage the battery sensing circuit and cause other deleterious system effects.

SUMMARY

Systems and methods are presented for detecting electrical leakages in a battery sensing circuit. More specifically, certain embodiments disclosed herein may allow a vehicle and/or battery control system to detect certain electrical leakages in a battery sensing circuit and implement one or more actions to protect vehicle systems from damage resulting from such leakages. A battery sensing circuit may be included as part of a battery sensing system. The battery sensing circuit may monitor a battery system and/or individual constituent battery cells (e.g., battery cells arranged in a stack).

Due to a variety of circumstances, a battery sensing circuit may experience an electrical leakage causing a resistive short. A resistive short may, among other things, result in errors in any measurements of battery cell voltage performed by a battery sensing circuit. Moreover, a resistive short may result in a thermal event within a battery sensing circuit if an associated leakage current reaches certain levels. Consistent with embodiments disclosed herein, a resistor may be disposed in series with a sense line of a battery sensing circuit. The resistor may exhibit a measurable voltage drop when there is leakage current flowing through the sense line and the battery sensing circuit. By measuring the voltage drop, an undesirable leakage current may be detected and one or more protective actions may be implemented.

In certain embodiments, a system may include a first battery cell. A battery sensing circuit may be coupled to the first battery cell by a first sensing line, a first resistor, and a first fuse disposed in series and a second sense line, a second resistor, and a second fuse disposed in series. Among other things, the battery sensing circuit may be configured to measure a first change in voltage over time of the first battery cell, measure a second change in voltage over time of a second battery cell disposed adjacent to the first battery cell in a battery stack, and determine whether the first change in voltage and the second change in voltage are different.

If the first change and second change in voltage are different, the battery sensing circuit may measure a first voltage of the first battery cell and measure a second voltage of the second battery cell. The battery sensing circuit may determine whether the first voltage and the second voltage are different by at least a first threshold amount. If the battery sensing circuit determines that the first voltage and the second voltage are different by at least the first threshold amount, a protective action may be implemented. In certain embodiments, the protective action may include performing one or more over-voltage or under-voltage diagnostic tests of the first battery cell, actuating a balancing switch associated with the first battery cell (e.g. for a particular period of time), triggering a fuse blow on at least one of the first fuse and the second fuse by actuating a balancing switch (e.g., by introducing current to a leakage path associated with the first battery cell), actuating one or more battery contactors, generating a notification signal to a user, and/or any other suitable protective action.

In further embodiments, a method for detecting a leakage path in a battery sensing circuit may include measuring a first change in voltage over time of a first cell in a battery stack and measuring a second change in voltage over time of a second cell in the battery stack. A determination may be made that the first change in voltage and the second change in voltage are different (e.g., by a threshold amount and/or the like). In response to the determination, a first voltage of the first cell and a second voltage of the second cell may be measured, and a determination may be made as to whether the first voltage and the second voltage are different by at least a first threshold amount. If the first voltage and the second voltage are different by at least the first threshold amount, a protective action may be implemented. In certain embodiments, the protective action may include performing one or more over-voltage or under-voltage diagnostic tests of the first battery cell, actuating a balancing switch associated with the first battery cell (e.g. for a particular period of time), triggering a fuse blow on at least one of the first fuse and the second fuse by actuating a balancing switch (e.g., by introducing current to a leakage path associated with the first battery cell), actuating battery contactors, generating a notification signal, and/or any other suitable protective action.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Figure 1:
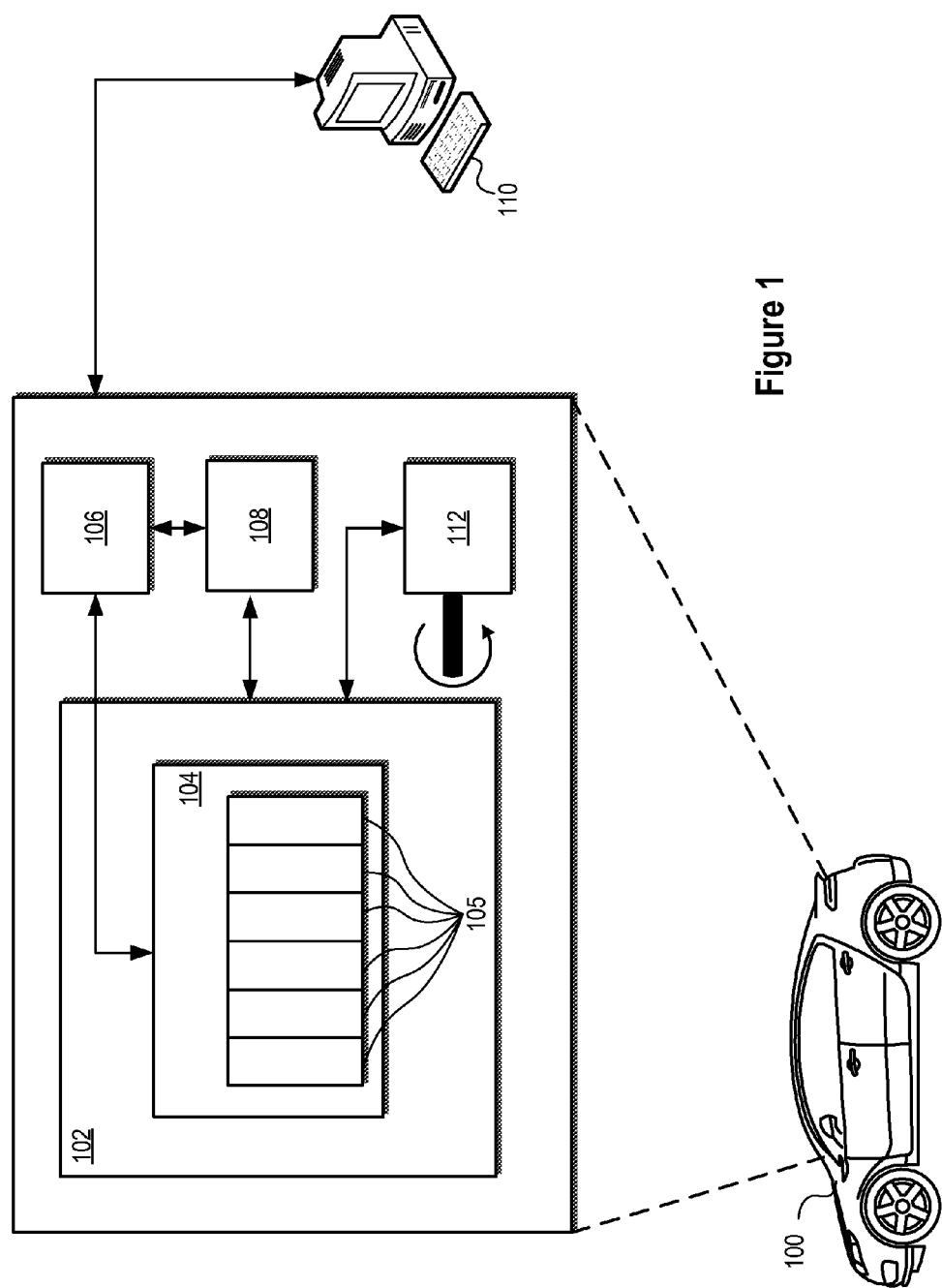
FIG. 1 illustrates a functional block diagram of an exemplary system for measuring operating parameters of a battery system in a vehicle consistent with embodiments disclosed herein.

FIG. 1 illustrates a functional block diagram of an exemplary system for measuring operating parameters of a battery system 102 in a vehicle 100 consistent with embodiments disclosed herein. The vehicle 100 may be a motor vehicle, a marine vehicle, an aircraft, and/or any other type of vehicle, and may include any suitable type of drivetrain for incorporating the systems and methods disclosed herein. While described herein in connection with a vehicle 100, the systems and methods disclosed herein may be used in connection a variety of other systems including, for example, battery systems associated with stationary power sources (e.g., generators) and/or the like. As illustrated, vehicle 100 may include a battery system 102 configured to provide electrical power to certain components of the vehicle 100. For example, battery system 102 may be configured to provide power to electric drivetrain components 112 of the vehicle 100. The battery system 102 may include a single battery cell 105 or multiple battery cells 105 arranged in a battery cell stack 104.

As illustrated, the battery system 102 may be configured to directly provide power to electric drivetrain components 112. In certain embodiments, the battery system 102 may be configured to provide power to one or more other systems (not shown) including low voltage battery systems (e.g., lead-acid 12V automotive batteries) that supply electric energy to a variety of vehicle 100 systems including, for example, vehicle starter systems (e.g., a starter motor), lighting systems, audio systems, and/or the like.

In certain embodiments a battery sensing circuit 106 may be communicatively coupled to one or more battery cells 105 included in the battery cell stack 104. The battery sensing circuit 106 may comprise any suitable number of battery sensing circuits, voltage sensors, switches, resistors, fuses, and/or any other electrical component and/or system in any suitable configuration for performing the methods disclosed herein. For example, in some embodiments, the battery sensing circuit 106 may, among other things, detect certain electrical leakages, implement one or more actions to protect vehicle systems from damage resulting from such leakages, circulate electrical power to various components and systems in connection with battery sensing operations, and/or the like. In certain embodiments, the battery sensing circuit 106 may monitor certain parameters of a battery system 102 and/or report a status relating to the battery system. Parameters monitored by the battery sensing circuit 106 may include, without limitation, battery voltage, current, charge state, and/or any other relevant parameters pertaining to the individual battery cells 105 and/or battery stack 104.

The battery system 102 and/or battery sensing circuit 106 may be communicatively coupled with an associated battery control system 108. The battery control system 108 may be configured to monitor and control certain operations of the battery system 102, the battery sensing circuit 106, and/or other associated systems. For example, the battery control system 108 may be configured to monitor and control operations of the battery stack 104 and/or its constituent battery cells 105. Further, the battery control system 108 may be configured to monitor and/or control leakage detection operations performed by the battery sensing circuit 106. In some embodiments, the battery control system 108 may be configured to monitor and/or control the operation of one or more balancing switches incorporated in the battery sensing circuit 106. In further embodiments, an internal vehicle computer system (not shown) and/or any other suitable external computer system 110 may be configured to monitor and control certain operations of the battery system 102, the battery control system 108, and/or the battery sensing circuit 106.

In certain embodiments, the battery control system 108 and/or the battery sensing circuit 106 may be communicatively coupled with one or more sensors associated with the battery system 102 and/or its constituent cells 105 including, for example, voltage sensors, current sensors, and/or any other suitable sensor or sensors that may provide information utilized in the systems and methods disclosed herein. For example, in some embodiments, one or more sensors associated with the battery system 102 and/or its constituent cells 105 may provide information used in measuring one or more voltage changes over time and/or voltages of battery cells 105.

Certain embodiments disclosed herein may allow the battery control system 108 and/or the battery sensing circuit 106 to, among other things, detect electrical leakages in the battery sensing circuit 106. The battery control system 108 and/or the battery sensing circuit 106 may implement one or more protective actions to mitigate damage and/or other issues resulting from such leakages. The protecting actions may include, without limitation, opening or closing one or more switches, blowing one or more fuses, sending one or more service signals to a driver of vehicle 100, and/or any other action that may protect the battery system 102 and/or battery sensing circuit 106 from undesirable conditions (e.g., thermal events and/or the like).

Figure 2:
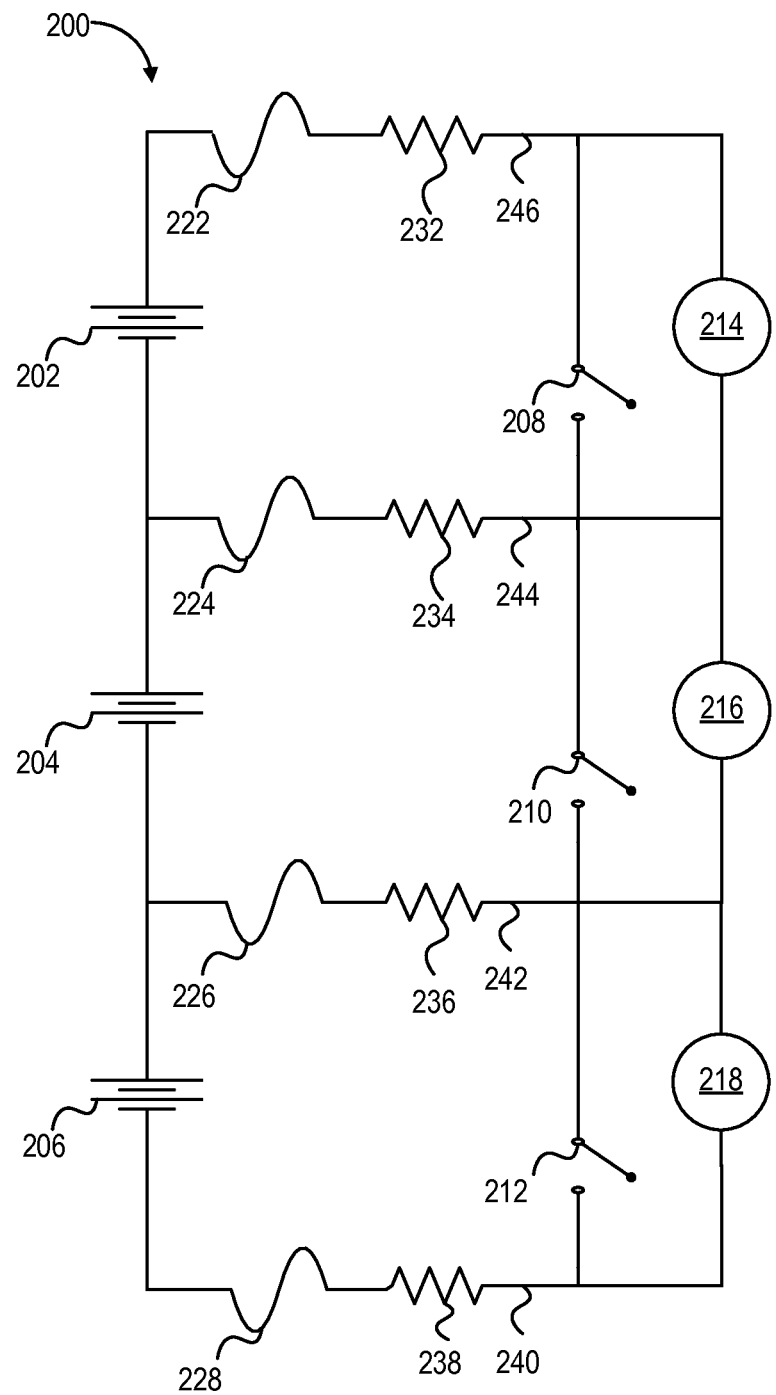
FIG. 2 illustrates a circuit diagram of an exemplary battery sensing circuit consistent with embodiments disclosed herein.

FIG. 2 illustrates an exemplary circuit diagram of a battery sensing circuit 200 consistent with embodiments disclosed herein. The battery sensing circuit 200 may be coupled to one or more battery cells 202-206 of a battery system via one or more sensing lines 240-246. Although illustrated as including three battery cells 202-206, embodiments of the systems and methods disclosed herein may be utilized in connection with a battery system having any suitable number of battery cells.

The battery sensing circuit 200 may include a plurality of voltage sensors 214-218 respectively coupled to the battery cells 202-206 via sensing lines 240-246, fuses 222-228, and resistors 232-238. As illustrated, sensing lines 240-246, fuses 222-228, and resistors 232-238 may be respectively coupled in series between a terminal of battery cells 202-206 and a terminal of voltage sensors 214-218. Voltage sensors 214-218 may be configured to measure voltages and/or changes in voltage over time across battery cells 202-206 respectively.

Resistors 232-238 may exhibit a measurable voltage drop (e.g., measurable by voltage sensors 214-218) when there is leakage current flowing through sense lines 240-246. By measuring the voltage drop, undesirable leakage currents may be detected and one or more protective actions may be implemented. In certain embodiments, voltage sensors 214-218 may detect one or more under and/or over voltage differences between battery cells 202-206 caused by leakage currents. Voltage sensors 214-218 may further measure one or more voltage changes over time of battery cells 202-206.

Based on measured voltage changes over time and/or voltage differences between battery cells 202-206, one or more leakage current events may be detected. If a leakage current event is detected, the battery sensing circuit 200 and/or a battery control system (not shown) may implement one or more protective actions. The protective action may include performing one or more over-voltage or under-voltage diagnostic tests of one or more battery cells 202-206. In further embodiments, the protective action may include actuating one or more balancing switches 208-212 (e.g., for a particular period of time) configured to facilitate selective energy transfer to, from, and/or between one or more battery cells 202-206. In yet further embodiments, the protective action may include triggering a fuse blow of one or more of fuses 222-228 associated with one or more battery cells 202-206. For example, in certain embodiments, the protective action may include triggering a fuse blow of one or more of fuses 222-228 (e.g., using one or more of switches 208-212) associated with one or more battery cells 202-206 based on a determination that a design current threshold of the battery sensing circuit 200 has been exceeded.

Figure 3:
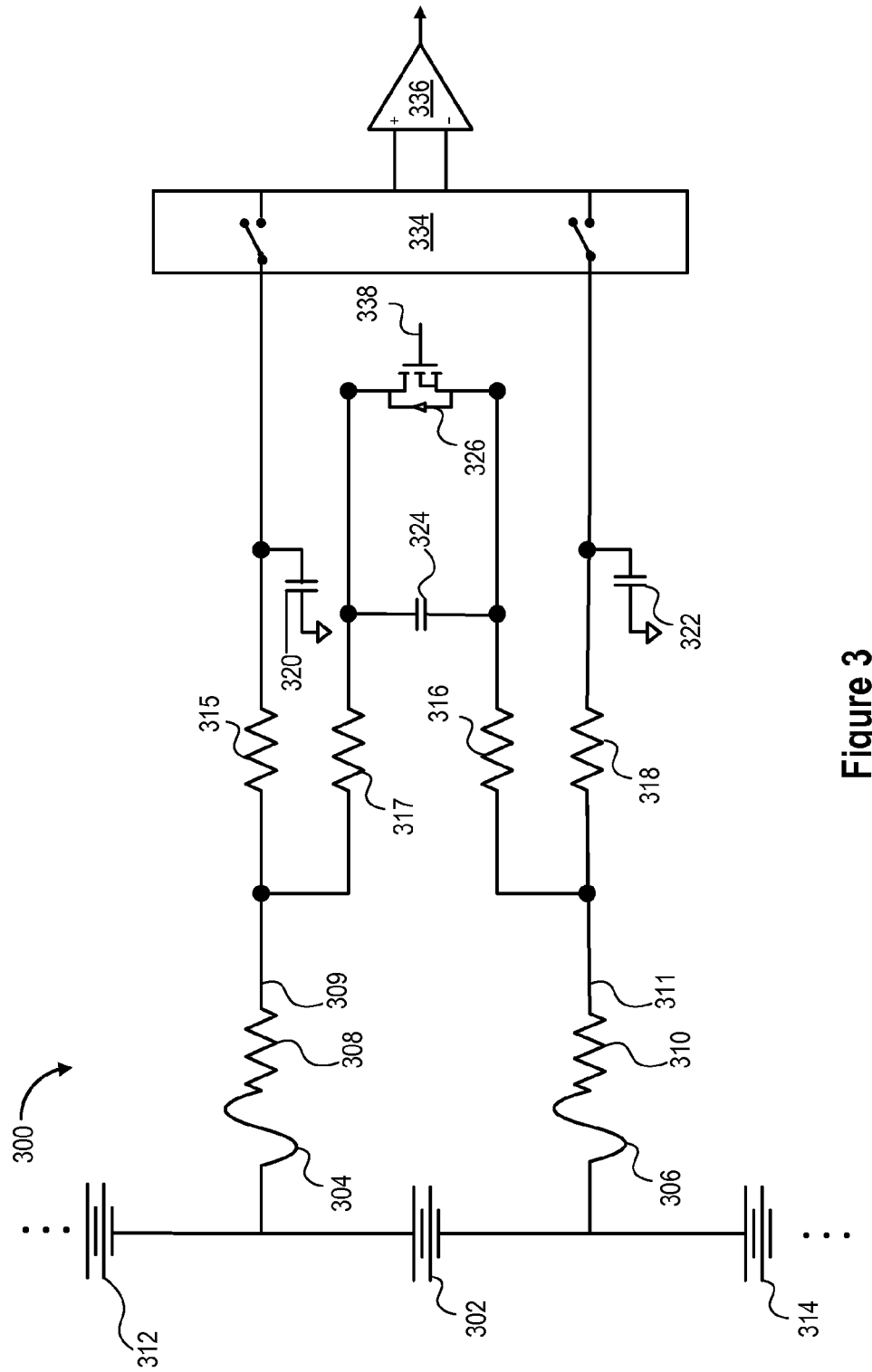
FIG. 3 illustrates a circuit diagram of another exemplary battery sensing circuit consistent with embodiments disclosed herein.

FIG. 3 illustrates a circuit diagram of another exemplary battery sensing circuit 300 consistent with embodiments disclosed herein. The battery sensing circuit 300 may be coupled to one or more battery cells 302, 312, 314 of a battery system via one or more sensing lines 309, 311. Although illustrated as including three battery cells 302, 312, 314, embodiments of the systems and methods disclosed herein may be utilized in connection with a battery system having any suitable number of battery cells.

Consistent with embodiments disclosed herein, sense lines 309, 311 may be coupled with fuses 304, 306 and resistors 308, 310 respectively in series. Signals (e.g., voltage and/or current signals relating to battery cells 302, 312, 314) may be provided to a multiplexer 334 by sense lines 309, 311. In certain embodiments, signals provided by sense lines 309, 311 may be filtered using one or more filters (e.g., an RC filter including resistor 315 and capacitor 320 and/or resistor 318 and capacitor 322) before being provided to multiplexer 334. Multiplexer 334 may provide signals from sense lines 309, 311 to one or more systems configured to detect leakage path conditions and implement appropriate protective actions (e.g., a vehicle computer system, a battery control system, and/or other portions of a battery sensing circuit 300). In certain embodiments, Signals provided by multiplexer 334 may be amplified by amplifier 336.

Resistors 308, 310 may exhibit a measurable voltage drop when there is leakage current flowing through sense lines 309, 311 associated with the battery sensing circuit 300. Battery cell voltages (e.g., voltages of battery cells 302, 312, 314) may vary within a certain range during normal charge and/or discharge activities. If a voltage and/or a change in voltage over time across a battery cell (e.g., battery cell 302) decreases more than other battery cells (e.g., battery cells 312, 314) and/or more than a particular threshold relative to other battery cells, a leakage path in the battery sensing circuit 300 may be detected. Based on such detection, the battery sensing circuit 300, a battery control system (not shown), and/or any other suitable system may implement one or more protective actions.

The protective action may include performing one or more over-voltage or under-voltage diagnostic tests of one or more battery cells 302, 312, 314. In further embodiments, the protective action may include actuating one or more balancing switches 326 (e.g., by applying a control signal to gate 338 and/or the like) configured to facilitate selective energy transfer to, from, and/or between one or more battery cells 302, 312, 314. In certain embodiments, the balancing switches 326 may be coupled to battery sense lines 309, 311 via one or more filtering circuits (e.g., an RC filtering circuit including resistors 316, 317 and capacitor 324 and/or the like).

In yet further embodiments, the protective action may include triggering a fuse blow of one or more of fuses 304, 306 associated with one or more battery cells 302, 312, 314. For example, in certain embodiments, the protective action may include triggering a fuse blow one or more of fuses 304, 306 (e.g., using one or more of switches) associated with one or more battery cells 302, 312, 314 by actuating an associated balancing switch 326.

Figure 4:
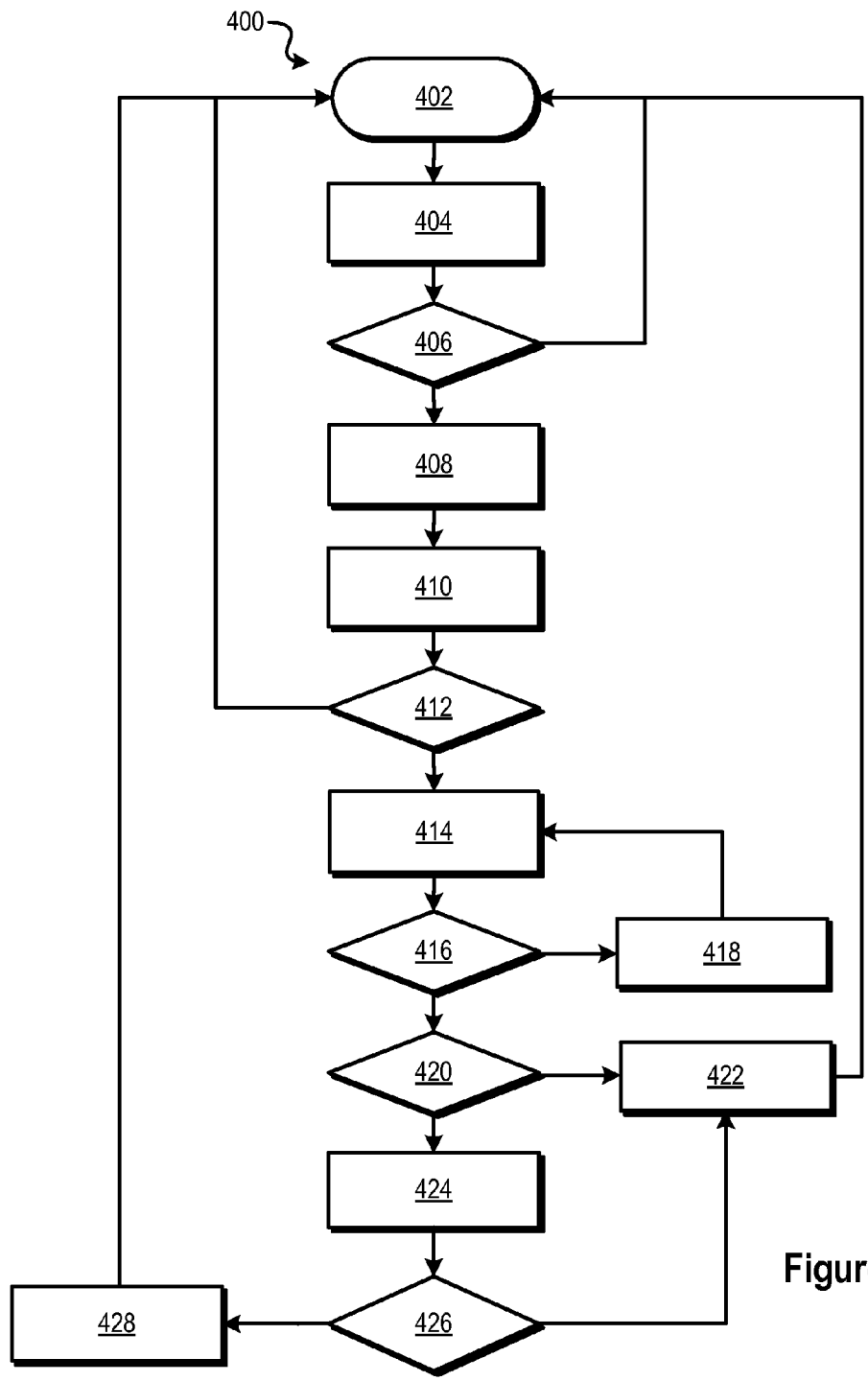
FIG. 4 illustrates a flow chart of an exemplary method for detecting an electrical leakage in a battery sensing circuit consistent with embodiments disclosed herein.

FIG. 4 illustrates a flow chart of an exemplary method 400 for detecting an electrical leakage on a battery sensing circuit consistent with embodiments disclosed herein. The illustrated method 400 may be performed using, at least in part, a vehicle computer system, a battery control system, a battery sensing circuit, and/or any other suitable system.

The method 400 may be initiated at 402. In certain embodiments, the method 400 may initiate 402 when a vehicle is turned off. At 404, voltages associated with one or more battery cells may be measured and/or recorded. Based on these voltages, a determination may be made at 406 if the vehicle is connected to a charger and been charge. If so, the method 400 may return to 402. If not, after a period of time (e.g., when the vehicle is turned back on), voltages associated with the one or more battery cells may again be measured and/or recorded at 408. At 410, changes in voltage over time may be calculated based on the voltages measured at 404 and 408.

At 412, a determination may be made whether the changes in voltage over time are different (e.g., different by at least a threshold amount). If it is determined that the changes in voltage over time are different, the method 400 may proceed to 414. Otherwise, the method 400 may return to 402.

At 414 the battery system may perform a voltage check of the adjacent battery cells. At 416, adjacent battery cell voltages are compared to the battery cell being evaluated. If the adjacent battery cell voltages are greater than the voltage of the battery cell being evaluated by a predetermined threshold, the method 400 may proceed to 420, if not the method may proceed to 418. At 418 the method 400 may switch to testing the adjacent battery cells for leakages and return back to step 414. At 420 the method 400 may perform one or more over-voltage or under-voltage diagnostic tests on the first battery cell. If there is found to be an over-voltage or under-voltage condition then the method 400 may continue to 424, if not then at 422 the system may report a resistive short on the cell and the method 400 may return to 402. At 424 a protective action comprising actuating a balancing switch associated with the first cell may be performed. The balancing switch may be actuated for a particular period of time. At 426 a determination may be made to see if further protective action needs to be taken. The further protective action may comprise triggering a fuse blow on a fuse disposed between the battery sensing circuit and the first battery cell by actuating the balancing switch. The determination of whether the fuse is blown may be based upon whether a leakage current exceeds a leakage current threshold. For example, if the leakage current is determined to exceed the maximum design current of the battery sensing circuit, the system may introduce current to the leakage path to cause a fuse blow on a fuse disposed between the battery sensing circuit and the battery cell. If the fuse is blown, the method 400 may proceed to 428 if not the method 400 may return to 422 to report a resistive short. At 428 control actions may be implemented for an open sense lead and the method 400 may return to 402.

Figure 5:
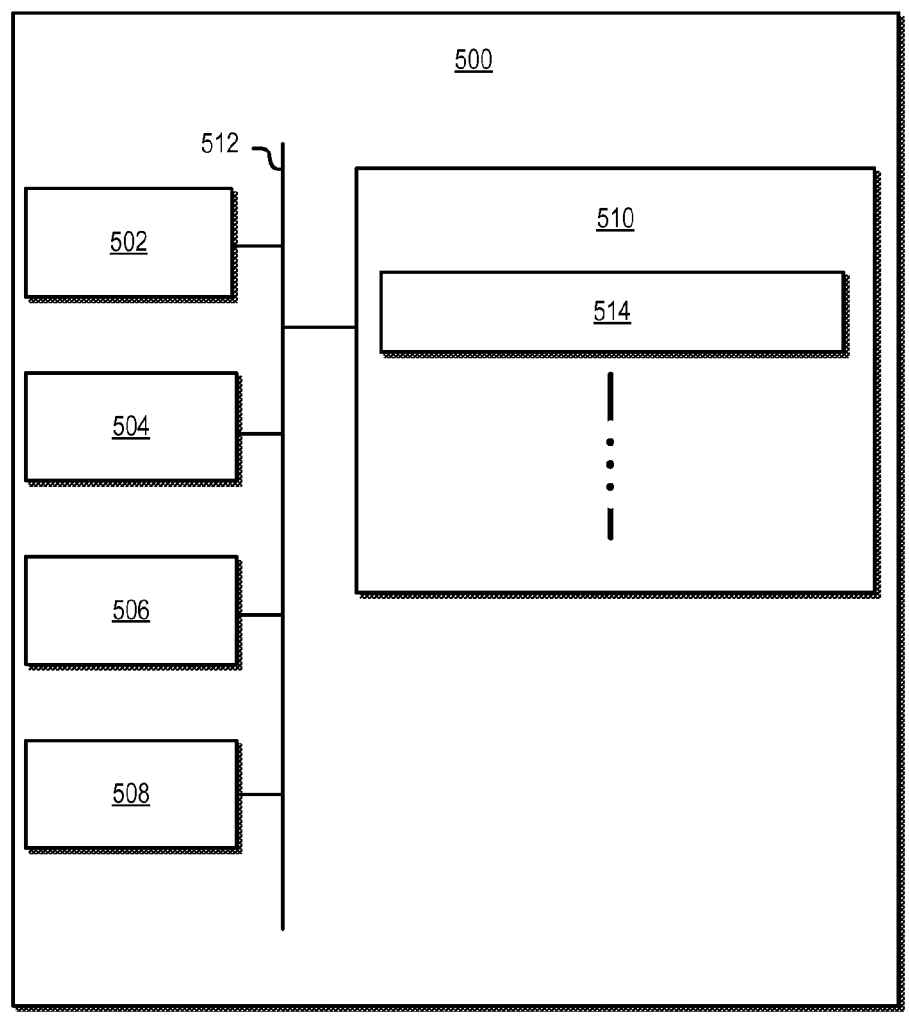
FIG. 5 illustrates a functional block diagram of an exemplary system for implementing certain embodiments of the systems and methods disclosed herein.

FIG. 5 illustrates a block diagram of a computer system 500 that may be utilized in implementing certain embodiments of the systems and methods disclosed herein. In certain embodiments, the computer system 500 may be a personal computer system, a server computer system, an on-board vehicle computer, a battery control system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory (RAM) 504, a communications interface 506, a user interface 508, and a non-transitory computer-readable storage medium 510. The processor 502, RAM 504, communications interface 506, user interface 508, and computer-readable storage medium 510 may be communicatively coupled to each other via a common data bus 512. In some embodiments, the various components of the computer system 500 may be implemented using hardware, software, firmware, and/or any combination thereof.

User interface 508 may include any number of devices allowing a user to interact with the computer system 500. For example, user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems (e.g., computer systems associated with external databases and/or the Internet), allowing for the transfer as well as reception of data from such systems. The communications interface 506 may include, among other things, a modem, a satellite data transmission system, an Ethernet card, and/or any other suitable device that enables the computer system 500 to connect to databases and networks, such as LANs, MANs, WANs and the Internet.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include a module to compare voltage differences over time, a module to activate safety control actions to prevent thermal damage or unwanted activity, and a module to track problems and notify a service technician of problem areas such as a blown fuse.

The system and methods described herein may be implemented independent of the programming language used to create the computer-readable instructions and/or any operating system operating on the computer system 500. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for detecting a leakage path in a battery sensing circuit, the method comprising:
   measuring a first change in voltage over time of a first cell in a battery stack;
   measuring a second change in voltage over time of a second cell in the battery stack;
   determining that the first change in voltage and the second change in voltage are different;
   measuring a first voltage of the first cell;
   measuring a second voltage of the second cell;
   determining that the first voltage and the second voltage are different by at least a first threshold amount; and
   implementing a protective action in response to determining that the first voltage and the second voltage are different by at least the first threshold amount.

2. The method of claim 1, wherein first cell and the second cell comprise adjacent cells in the battery stack.

3. The method of claim 1, wherein the protective action comprises generating a notification signal indicating the existence of a leakage path.

4. The method of claim 1, wherein the protective action comprises actuating a contactor associated with the battery stack.

5. The method of claim 1, wherein the protective action comprises actuating a balancing switch for a particular period of time.

6. The method of claim 1, wherein the protective action further comprises triggering a fuse blow on a fuse disposed between the battery sensing circuit and the first cell by actuating a balancing switch.

7. The method of claim 1 wherein the protective action comprises actuating a balancing switch associated with the first cell based on a determination that a leakage current through a sense line of the battery sensing circuit exceeds a second threshold amount.

8. The method of claim 7, wherein the second threshold amount comprises a maximum design current of the battery sensing circuit.

9. The method of claim 1, wherein determining that the first change in voltage and the second change in voltage are different comprises determining that the first change in voltage and the second change in voltage are different by at least a second threshold amount.

10. The method of claim 1, wherein determining that the first voltage and the second voltage are different by at least the first threshold amount comprises determining that the first voltage is lower than the second voltage.

11. The method of claim 1, wherein the protective action comprises introducing current to the leakage path to trigger a fuse blow on a fuse disposed between the battery sensing circuit and the first cell.

12. A system comprising:
   a first battery cell;
   a battery sensing circuit coupled to the first battery cell by a first sense line, a first resistor, and a first fuse disposed in series and a second sense line, a second resistor, and a second fuse disposed in series,
   wherein the battery sensing circuit is configured to:
      measure a first change in voltage over time of the first battery cell;
      measure a second change in voltage over time of a second battery cell disposed adjacent to the first battery cell in a battery stack;
      determine that the first change in voltage and the second change in voltage are different;
      measure a first voltage of the first battery cell;
      measure a second voltage of the second battery cell;
      determine that the first voltage and the second voltage are different by at least a first threshold amount; and
      implement a protective action in response to determining that the first voltage and the second voltage are different by at least the first threshold amount.

13. The system of claim 12, wherein the protective action comprises generating a notification signal indicating the existence of a leakage path.

14. The system of claim 12, wherein the protective action comprises actuating a contactor associated with the battery stack.

15. The system of claim 12, wherein protective action comprises actuating a balancing switch for a particular period of time.

16. The system of claim 12, wherein the protective action further comprises triggering a fuse blow on a fuse disposed between the battery sensing circuit and the first cell by actuating a balancing switch.

17. The system of claim 12, wherein the protective action comprises actuating a balancing switch based on a determination that a leakage current through the first sense line and the second sense line of the battery sensing circuit exceeds a second threshold amount.

18. The system of claim 17, wherein the second threshold amount comprises a design current threshold of the battery sensing circuit.

19. The method of claim 12, wherein determining that the first change in voltage and the second change in voltage are different comprises determining that the first change in voltage and the second change in voltage are different by at least a second threshold amount.

20. The method of claim 12, wherein the protective action comprises introducing current to a leakage path associated with the first battery cell configured to trigger a fuse blow of at least one of the first fuse and the second fuse.

* * * * *